United States Patent [19]
Gesche et al.

[11] Patent Number: 5,140,223
[45] Date of Patent: Aug. 18, 1992

[54] CIRCUIT FOR ADJUSTING THE IMPEDANCE OF A PLASMA SECTION TO A HIGH-FREQUENCY GENERATOR

[75] Inventors: Roland Gesche, Seligenstadt; Stefan Locher, Alzenau, both of Fed. Rep. of Germany

[73] Assignee: Leybold Aktiengesellschaft, Hanau, Fed. Rep. of Germany

[21] Appl. No.: 412,249

[22] Filed: Sep. 25, 1989

[30] Foreign Application Priority Data

Jul. 18, 1989 [DE] Fed. Rep. of Germany ....... 3923661

[51] Int. Cl.$^5$ ............................ H01J 7/24; H05H 1/46
[52] U.S. Cl. ............................ 315/111.21; 313/231.31; 331/74; 333/32
[58] Field of Search .................. 315/111.21, 111.81, 315/248; 313/231.31; 331/74; 333/32

[56] References Cited

U.S. PATENT DOCUMENTS

| | | | |
|---|---|---|---|
| 3,569,777 | 3/1971 | Beaudry | 315/111.21 |
| 4,207,137 | 6/1980 | Tretola | 156/627 |
| 4,373,581 | 2/1983 | Toellner | 333/32 X |
| 4,810,933 | 3/1989 | Moisan et al. | 315/111.21 X |
| 4,827,219 | 5/1989 | Harrison | 333/32 X |
| 4,877,999 | 10/1989 | Knapp et al. | 315/111.21 X |

FOREIGN PATENT DOCUMENTS 3638880 5/1987 Fed. Rep. of Germany .
3821208 11/1989 Fed. Rep. of Germany .

OTHER PUBLICATIONS

Enhancement of the plasma density and deposition rate in rf discharges—Overzet et al.
Power loss mechanisms in radio frequency dry etching systems—W. G. M. van den Hoek et al.
Deposition of Tantalum and Tantalum Oxide by Superimposed RF and D-C Sputtering—F. Vratny.

Primary Examiner—Eugene R. LaRoche
Assistant Examiner—Do Hyun Yoo
Attorney, Agent, or Firm—Weil, Gotshal & Manges

[57] ABSTRACT

A circuit for adjusting the impedance of a plasma section to a high-frequency generator wherein three capacitors are connected in series between the high-frequency generator and an electrode of the plasma section; located between the generator and the electrode are two parallel oscillatory circuits.

5 Claims, 1 Drawing Sheet

CIRCUIT FOR ADJUSTING THE IMPEDANCE OF A PLASMA SECTION TO A HIGH-FREQUENCY GENERATOR

BACKGROUND OF THE INVENTION

The invention concerns a circuit for adjusting the impedance of a plasma section to a high-frequency generator.

When producing plasma with a high-frequency generator, e.g., a generator oscillating at 13.56 MHz, the problem arises that a portion of the high-frequency energy does not go into the plasma, but is reflected back to the generator since the generator cannot be continuously adjusted to the plasma section. Adjustment difficulties are caused, for example, by the fact that the plasma impedance changes perpetually by approximately a factor of 2, while the matching impedance of the generator is constant. For instance the impedance of a 13.56 MHz generator normally comes to 50 Ohms. Much greater matching problems arise when the electrodes are reversed and impedance changes of several powers of ten occur, i.e., between 10 Ohms and 1000 Ohms. Optimal wattage match thus results only at a few impedances of the plasma; at all other impedances, reflective phenomena appear. One way to optimize the wattage match could consist of holding the plasma impedance constant. However, this would involve extremely high expenses, since the plasma impedance is dependent on numerous parameters such as the geometry of the unit, the type of electrode, the screening, gas feeds, type of gas and gas pressure.

A device for the production of HF-induced inert gas plasma is already known, in which a steadily burning plasma can be produced (German Patent No. DE-OS 36 38 880). The energy required here to ignite and maintain the plasma is excited capacitatively via two opposing capacitor plates between which the plasma is formed and/or located. The capacitor plates which form an oscillatory circuit together with an inductor, are supplied with HF voltage, the frequency of which is the same as the resonant frequency of the oscillatory circuit. Wattage matching with variable plasma impedance is not possible with this known device.

In another known device for HF-induced dry etching, the ratio between the total HF wattage of an HF generator and the power actually converted into wattage is determined (van der Hoek, de Vries and Heljman; "Power Loss Mechanisms in Radio Frequency Dry Etching Systems," *J. Vac. Sci. Technol.* B 5(3), May/June 1987, pp. 647-651). In this device, the HF wattage is fed into the plasma reactor through an accommodating connection, since the initial impedance of the generator is normally 50 Ohms, while the plasma impedance is generally capacitative at a high frequency. The matching network is thus required to maintain an optional power transfer. In any event, an L-circuit is provided in the known device for wattage matching, which is suitable only for a limited range of the plasma impedance.

Furthermore, a procedure for regulating a plasma etching process is known, in which the impedance changes in HF wattage are indicated (U.S. Pat. No. 4,207,137). Here a standard LC matching circuit is used, corresponding to the above-mentioned L-circuit.

A sputtering device is also known, in which an HF voltage is superimposed on direct current; it has a matching circuit (F. Vratny, "Deposition of Tantalum and Tantalum Oxide by Superimposed RF and DC Sputtering," *J. Electrochem. Soc.: Solid State Science*, Vol. 114, No. 5, 1967, pp 505-508). The matching circuit for the sputtering device here is created through a connection and/or a transformer coupling in the form of an L-circuit, and T- and Pi-members are also indicated as possible, with reference to the state of the art (B. Goodman, *The Radio Amateur's Handbook*, American Radio Relay League, Newington, Conn., 1966).

Further, a Cauer LC high-pass is also known, in which three capacitors are provided on the series arm and in which series circuits of one capacitor and one inductor are provided in the cross arm located between the capacitors (W. Rienecker, Elektrische Filtertechnik [Electrical Filtering Techniques], 1981, p. 100).

Finally, a circuit for the wattage matching of a high-frequency generator was proposed in which a T-member is provided between the high-frequency generator and the plasma section, which has two variable series capacitors and one fixed shunt inductor (German Patent Application P 38 21 134.2). This known circuit is less suitable for high load impedances, since it then requires a coil with high inductance (>2000 nH), which is relatively bulky.

The invention is therefore based on the task of creating a matching circuit suitable for high load impedances.

This task is solved by the characteristics set forth in claim 1. The advantage attained with the invention consists particularly in the fact that even at high load impedances, relatively low inductances (approximately 500 nH and 750 nH) suffice, whereby the whole matching circuit can be built much more compactly. An embodiment of the invention is presented in the accompanying drawings and described in greater detail below.

DESCRIPTION OF THE PREFERRED EMBODIMENT

Figure 1:
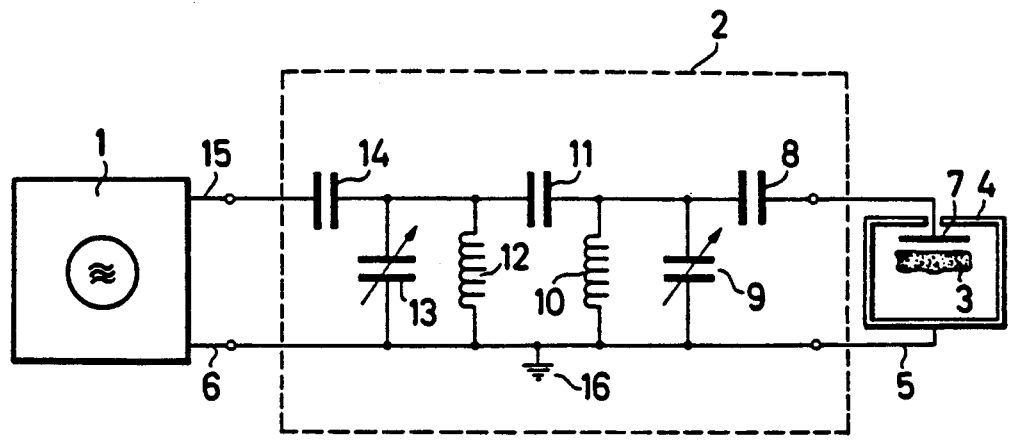
FIG. 1 is a schematic representation of the principle of the matching circuit pursuant to the invention.

FIG. 1 shows a high-frequency generator which, for example, emits a 13.56 MHz signal. This signal, in the short-wave range, is fed to plasma section 3 through matching circuit 2, which section is located inside housing 4, which is connected via line 5 to output terminal 6 of high-frequency generator 1. The reciprocal pole to housing 4 under voltage is electrode 7, which is connected via a terminal on capacitor 8 of, e.g., 250 pF, to matching circuit 2. The other terminal on this capacitor 8 is connection with a terminal on variable capacitor 9, whose capacitance, for example, is variable in the range of 10 pF to 500 pF, and with a terminal on capacitor 11 with a capacitance of, e.g., 100 pF. The other terminal on variable capacitor 9 as well as the other terminal on inductor 10 are connected to line 5. The terminals of additional coil 12, with an inductance, of e.g., 750 nH, are connected to this line 5, as is an additional variable capacitor 13 with a capacitance of, e.g., 10 pF to 500 pF, where the other terminal is connected to the second terminal on capacitor 11 of 100 pF and with the first terminal on capacitor 14, also 100 pF. This capacitor 14 is connected via its second terminal to the second output terminal 15 of high-frequency generator 1.

The following current and voltage loads fall on the individual components of matching circuit 2, at various load impedances and 5000 W of power:

Capacitor 8: I=48 A U=2300 V
Capacitor 9: I=43 A U=4500 V
Coil 10: I=106 A U=4500 V
Capacitor 11 I=28 A U=3300 V
Coil 12: I=20 A U=1300 V
Capacitor 13: I=38 A U=1300 V
Capacitor 14: I=10 A U=1200 V.

This demonstrates that the load is largest on the output side of parallel oscillatory circuit 9, 10. This parallel oscillatory circuit 9, 10, as well as the other parallel oscillatory circuit 12, 13, can easily be cooled potential-free in water or similar, since both oscillatory circuits are connected to line 5 and thus to the ground connection. In the same way, there is no difficulty in cooling fixed capacitor 11 potential-free, and capacitors 8 and 14 are to be cooled potential-free on at least one side. Fixed capacitors are also available in forms in which high voltages are possible without special cooling.

Figure 2:
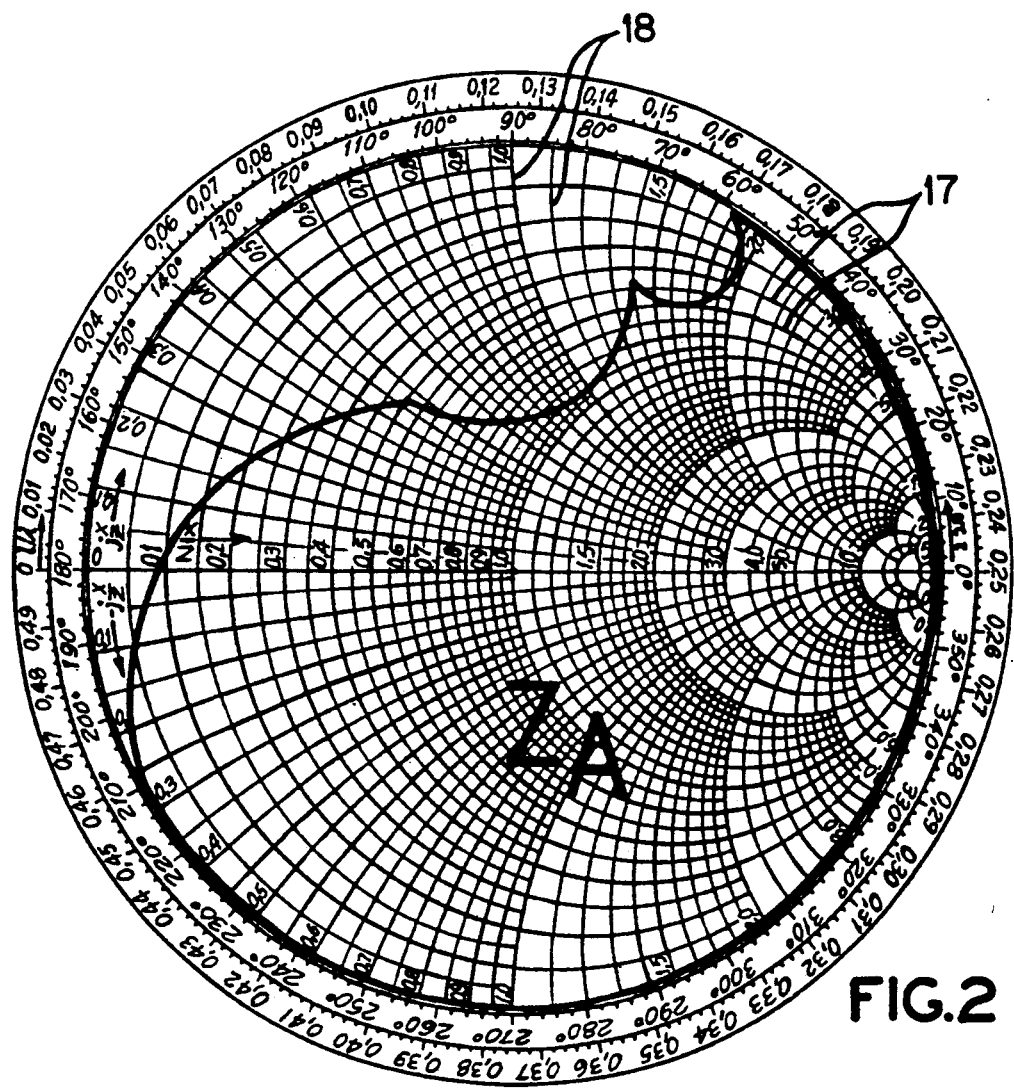
FIG. 2 is a Smith diagram which represents the impedance range covered by the matching circuit pursuant to the invention.

As shown in the Smith diagram of FIG. 2, a very large matching range can be created with the circuit pursuant to the invention. This creation is possible with components that are available and not of major cost. In particular, the problematic high-Ohm range is covered by the circuit pursuant to the invention.

The Smith diagram in FIG. 2 indicates plasma impedance $Z_A$, by a thick line. This diagram serves mainly to determine resistances on lines. The end of the line is not always accessible for measurements, but the transformed resistance can be measured only at the entry to the line. To be able to trace back from measurable values, e.g., the ratio line length $p$ to wave length $\lambda$, which can be determined by measuring $U_{max}$ and $U_{min}$, to the terminal resistance, Buschbeck and Schmidt propose a diagram in which at one time $U_{min}/U_{max}$, and at one time $p/\lambda$ are held constant. This Buschbeck diagram, however, has the disadvantage that only a portion of the right half-plane can be represented. This disadvantage is avoided in the line diagram of P. H. Smith, which shows the entire right half-plane on the inside of a circle of unit radius and takes the large resistance values including an infinite one.

In the Smith diagram representation, a distinction is drawn between a magnitude-phase representation and a real-section/imaginary-section representation. FIG. 2 shows a Smith diagram with real an imaginary sections, in which the plane is represented in the reflection-factor plane, and $Z_A$ this in the lower portion, which represents the capacitative impedance plane, while the upper portion shows the inductive impedance plane. The reflection factor, as a complex value, can be represented, as is known, in real and imaginary sections, where with a representation in polar coordinates, the X-curves of a constant reflection factor are concentric circles around a zero point. With circle 17 it is a question, therefore, of an appropriate representation of the straight lines of real section R=const, while with curves 18 it involves appropriate representations of the straight lines of imaginary section x=const.

Impedance factor $\psi = -4\pi p/\lambda$ is traced on the circumference of the circle of unit radius. The circumference scales are then degree scales or they directly represent the ratio of $p/\lambda$. Both scales are shown in FIG. 2.

Since the Smith diagram is known, reference is made to the technical literature for better comprehension (e.g., Fricke/Lamberts/Schuchardt: *Elektrische Nachrichtentechnik* [Electrical Communications Engineering], Volume VI, Part 1, Bases, 1964, pp. 160–165, as well as Meinke/Gundlach: *Taschenbuch der Hochfrequenztechnik* [High-Frequency Technology Handbook], 4th edition, 1986, C 27).

The circuit pursuant to the invention can be used expediently at high-frequencies wattages between 500 W and 15 KW. With an efficiency in a cold state of approximately 95%, heat losses between 25 W and 750 W occur during operations. Water cooling is therefore required to avoid thermal disturbance of the components.

When producing plasma via high frequency for use in coating materials, it is common to regulate the matching constantly. Different embodiments of automatic matching networks have already been proposed. However, problems arise in these matching networks that, among other things, are based on the fact that special measurement uptakes are required with which the complex impedances can be measured at high wattages. The conceivable alternative of measuring the plasma impedance directly and calculating the necessary capacitor positions from this can be created only with difficulty, since there are no usable impedance measurement devices that would be suitable for the relevant impedance range.

What is claimed is:

1. A device for a steadily burning plasma comprising a high frequency generator designed for a load of approximately fifty Ohms and having a frequency of approximately 13.56 MHz;
a plasma chamber (3) comprising a first electrode (7) and a sound electrode (4);
a matching circuit (2) connecting said first and second electrodes (7,4) with said high frequency generator (1); said matching circuit (2) including two parallel resonant circuits (12, 13; 9, 10) coupled with a first fixed capacitance (11) and having capacitive input and output connections with second and third fixed capacitances (14, 8), respectively;
said parallel resonant circuits (12, 13; 9, 10) being placed on one side of a ground connection, the two parallel resonance circuits (12, 13; 9, 10) each including a fixed inductor and a variable shunt capacitor, the parallel resonance circuit (12, 13) on the generator side having an inductance of 750 nH and a variable capacitance of 10 pF to 500 pF, and the load-side resonance circuit (9, 10) having an inductance of 500 nH and a variable capacitance of 10 pF to 500 pF, said two parallel resonant circuits (12, 13; 9, 10) being connected with one of their sides to ground and being placed in a cooling device.

2. The device of claim 1 wherein the first and second fixed capacitances have values of 100 pF and the third fixed capacitance is 250 pF.

3. The device of claim 1 wherein the variable capacitances of the parallel resonant circuits are varied as a function of the impedance of the plasma chamber.

4. The device of claim 3 further comprising means for measuring the impedance of the plasma chamber and wherein the variable capacitances of the parallel resonant circuits are varied as a function of the measured impedance of the plasma chamber.

5. The device of claim 3 further comprising means for measuring the input impedance of the matching circuit (2) and means for balancing the input impedance of the matching circuit (2) to the impedance of the frequency generator (1) by adjusting the variable capacitors of said parallel resonant circuits.

* * * * *